United States Patent
Yamazaki

(10) Patent No.: US 11,589,485 B2
(45) Date of Patent: Feb. 21, 2023

(54) SHIELD CASE

(71) Applicant: NISSAN MOTOR CO., LTD., Yokohama (JP)

(72) Inventor: Tsutomu Yamazaki, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 17/055,296

(22) PCT Filed: May 18, 2018

(86) PCT No.: PCT/IB2018/000713
§ 371 (c)(1),
(2) Date: Nov. 13, 2020

(87) PCT Pub. No.: WO2019/220166
PCT Pub. Date: Nov. 21, 2019

(65) Prior Publication Data
US 2021/0185864 A1 Jun. 17, 2021

(51) Int. Cl.
*H05K 9/00* (2006.01)

(52) U.S. Cl.
CPC ......... *H05K 9/0049* (2013.01); *H05K 9/0015* (2013.01)

(58) Field of Classification Search
CPC .. H05K 9/0049; H05K 9/0009; H05K 9/0026; H01L 23/552
See application file for complete search history.

(56) References Cited

U.S. PATENT DOCUMENTS

| | | | | |
|---|---|---|---|---|
| 6,065,530 | A * | 5/2000 | Austin | H05K 7/2039 165/185 |
| 2005/0221638 | A1* | 10/2005 | Berberich | H01R 13/719 439/76.1 |
| 2013/0025928 | A1* | 1/2013 | Quek | H05K 9/0009 29/887 |
| 2014/0268578 | A1* | 9/2014 | Dolci | H05K 1/021 361/719 |
| 2015/0289419 | A1* | 10/2015 | Kouya | H05K 9/0022 333/12 |
| 2016/0227662 | A1* | 8/2016 | Xiao | H05K 9/0045 |
| 2017/0103935 | A1* | 4/2017 | Ishimine | H01L 23/3675 |
| 2017/0290207 | A1* | 10/2017 | Smith | H05K 9/0088 |

FOREIGN PATENT DOCUMENTS

| | | |
|---|---|---|
| EP | 3 768 051 A1 | 1/2021 |
| JP | 51-113145 U | 9/1976 |
| JP | H05-243695 A | 9/1993 |

(Continued)

*Primary Examiner* — Hung V Ngo
(74) *Attorney, Agent, or Firm* — Foley & Lardner LLP

(57) ABSTRACT

A shield case including a base portion made of a nonmetal material and having a mounting surface on which the electronic component is mounted, a cover portion made of a metal material and covering surroundings of the electronic component and a metal plate abutting with an outer surface of the base portion and having an end portion projecting outward from the base portion. A side-wall end portion of the cover member includes a first end abutting with the mounting surface of the base portion, and a second end extending in a thickness direction of the base portion and abutting with the end portion of the metal plate.

8 Claims, 7 Drawing Sheets

(56) References Cited

FOREIGN PATENT DOCUMENTS

| | | | |
|---|---|---|---|
| JP | 5-283876 | A | 10/1993 |
| JP | 07-014687 | U | 3/1995 |
| JP | 2586966 | Y2 | 12/1998 |
| JP | 2000-138485 | A | 5/2000 |
| JP | 2006-294754 | A | 10/2006 |
| JP | 2013-110358 | A | 6/2013 |

\* cited by examiner

SHIELD CASE

TECHNICAL FIELD

The present invention relates to a shield case in which an electronic component is storable.

BACKGROUND ART

A shield case is configured such that an electronic component is stored therein, and the shield case prevents an electromagnetic wave generated from the electronic component from being radiated to outside the case and prevents the electromagnetic wave from entering the case from outside the case. When the shield case is formed by use of a thick metal material, a shielding property improves. However, this is unfavorable from the viewpoint of weight reduction, cost, and processability. It is necessary to provide, in a base portion on which an electronic component is to be mounted, a passage for cooling the component. In a case where the base portion is made of a nonmetal material, it is difficult to incorporate a metal plate for shielding into the base portion, and it is necessary to incorporate a metal material into an outer periphery of the base portion. Further, in order to secure insulation from the electronic component, it is preferable that the base portion be made of a nonmetal material.

In a case where a shield case in which an electronic component is stored is made of a nonmetal material, such a technology has been known that a metal plate is provided inside the nonmetal material in consideration of a shielding property. For example, in JP 2013-110358 A, side walls of the shield case are manufactured by use of resin, and a metal plate is provided inside the resin, so that a shielding property is secured.

SUMMARY OF INVENTION

However, in the shield case described above, the metal plate is provided inside the resin, thereby causing such a problem that machining is difficult and a manufacturing cost increases. Further, in a case where the technology of JP 2013-110358 A is applied to a base portion on which an electronic component is to be mounted, a metal plate having a shape that avoids a cooling passage should be provided inside the base portion made of a nonmetal material such as resin, so that a shielding property decreases.

An object of the present invention is to provide a shield case which can be easily machined and which has an excellent shielding property.

According to an aspect of this invention, there is provided a shield case including a base portion made of a nonmetal material and having a mounting surface on which the electronic component is mounted, a cover portion made of a metal material and covering surroundings of the electronic component and a metal plate abutting with an outer surface of the base portion and having an end portion projecting outward from the base portion. A side-wall end portion of the cover member includes a first end abutting with the mounting surface of the base portion, and a second end extending in a thickness direction of the base portion and abutting with the end portion of the metal plate.

DESCRIPTION OF EMBODIMENTS

With reference to the drawings, the following describes embodiments of the present invention.

First Embodiment

Figure 1:
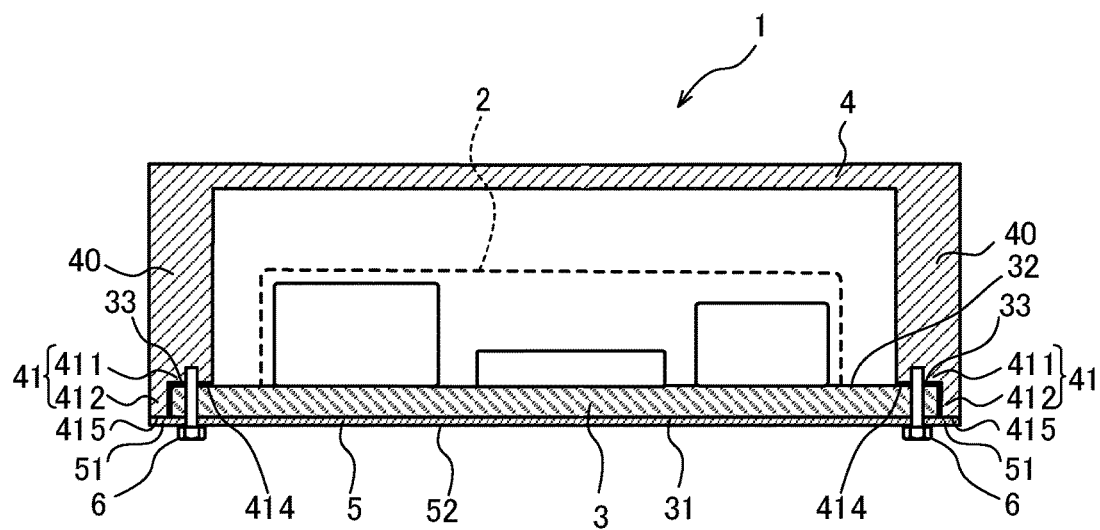
FIG. 1 is a schematic configuration diagram illustrating a shield case according to a first embodiment.

FIG. 1 is a schematic configuration diagram illustrating a shield case 1 according to a first embodiment. The shield case 1 illustrated in FIG. 1 is a case in which an electronic component 2 is stored.

As illustrated in FIG. 1, the shield case 1 is constituted by a base portion 3 on which the electronic component 2 is mounted, a cover portion 4 covering the surroundings of the electronic component 2, and a metal plate 5 abutting with an outer surface 31 of the base portion 3.

The electronic component 2 is an inverter mounted in a vehicle or the like, for example. The shield case 1 prevents an electromagnetic wave generated from the electronic component 2 from being radiated to outside the case and also prevents the electromagnetic wave from entering the case from outside the case and causing malfunction of the electronic component 2.

The base portion 3 is made of an insulating nonmetal material such as resin, for example, and the electronic component 2 is mounted on a mounting surface 32 of the base portion 3. A cooling passage (not shown) through which refrigerant to cool off the electronic component 2 flows is formed inside the base portion 3.

The cover portion 4 is made of a metal material such as aluminum, for example, and covers the surroundings of the electronic component 2. An end portion 41 (a side-wall end portion 41) of a side wall 40 of the cover portion 4 abuts with the mounting surface 32 of the base portion 3 and an end portion 51 of the metal plate 5. Note that details of an abutment structure for the cover portion 4, the base portion 3, and the metal plate 5 will be described later.

The metal plate 5 is provided so as to abut with the outer surface 31 of the base portion 3. An outer shape of the metal plate 5 is formed to be larger than an outer shape of the outer surface 31 of the base portion 3, and the end portion 51 placed on an outer peripheral edge of the metal plate 5 projects outward from the base portion 3.

Next will be described the abutment structure for the cover portion 4, the base portion 3, and the metal plate 5.

As illustrated in FIG. 1, the cover portion 4 is configured such that the end portion 41 (the side-wall end portion 41) of the side wall 40 abuts with an end portion 33 placed on an outer peripheral edge of the mounting surface 32 of the base portion 3 and the end portion 51 placed on the outer peripheral edge of the metal plate 5. As will be described later, the cover portion 4, the base portion 3, and the metal plate 5 are fastened jointly by a bolt 6 (a fastening member).

The side-wall end portion 41 of the cover portion 4 includes a first end 411 an end surface 414 of which abuts with the mounting surface 32 of the base portion 3, and a second end 412 extending in a thickness direction of the base portion 3 from a part outward from the first end 411. An inner side face, in the thickness direction of the base portion 3, of the second end 412 abuts with the base portion 3, and a distal surface 415 of the second end 412 abuts with the end portion 51 of the metal plate 5. Note that the inner side face of the second end 412 may not necessarily abut with the base portion 3.

An internal thread is cut in a central part of the end surface 414 of the first end 411 so that a bolt can be fastened, and respective through-holes for the bolt are provided in the base portion 3 and the metal plate 5, at respective positions corresponding to the internal thread, the positions being close to the end portions of the base portion 3 and the metal plate 5. A cylindrical collar made of metal or the like is inserted into the through-hole provided in the base portion 3 so as to prevent the fastened bolt from being loosened.

When the bolt 6 is screwed into the internal thread of the first end 411 of the side-wall end portion 41 through the through-holes of the metal plate 5 and the base portion 3 from an outer surface 52 of the metal plate 5, the cover portion 4, the base portion 3, and the metal plate 5 are fastened jointly and fixed in an integrated manner. Note that it is preferable that the metal plate 5 have a thickness that allows the metal plate 5 to deform by a fastening force when the metal plate 5 is fastened jointly by the bolt 6. However, the thickness of the metal plate 5 is not limited to this.

A seal groove (not shown) is provided in the first end 411, at a position closer to an inner side than the position where the bolt 6 is screwed, and a sealing member such as an O-ring is fitted into the seal groove. By providing the sealing member at the position closer to the inner side than the bolt 6, it is possible to prevent water or the like from entering the shield case 1 from outside.

The shield case 1 of the first embodiment described above can yield the following effects.

The shield case 1 includes the metal plate 5 abutting with the outer surface 31 of the base portion 3 made of a nonmetal material. Hereby, in comparison with a case where the metal plate 5 is provided inside the base portion 3, machining can be easily performed, and a cost reduction can be achieved. Further, since the metal plate 5 is provided so as to abut with the outer surface 31 of the base portion 3, it is not necessary to provide the metal plate 5 having a shape that avoids a cooling passage formed inside the base portion 3. Hereby, in comparison with a case where the metal plate 5 is provided inside the base portion 3, it is possible to secure an excellent shielding property.

In the shield case 1, the side-wall end portion 41 of the cover portion 4 made of a metal material includes the second end 412 extending in the thickness direction of the base portion 3. The distal surface 415 of the second end 412 abuts with the end portion 51 of the metal plate 5. Hereby, the electronic component 2 is completely covered with metal members, that is, the cover portion 4 and the metal plate 5. Accordingly, even in a case where the base portion 3 is made of a nonmetal material, it is possible to secure an excellent shielding property.

Note that a setting direction of the shield case 1 can be determined to be any direction. For example, the shield case 1 may be provided in a reverse manner in the up-down direction from the state in FIG. 1 so that the metal plate 5 is placed on the upper side and the cover portion 4 is placed on the lower side, or the shield case 1 may be provided in an inclined state.

Second Embodiment

Figure 2:
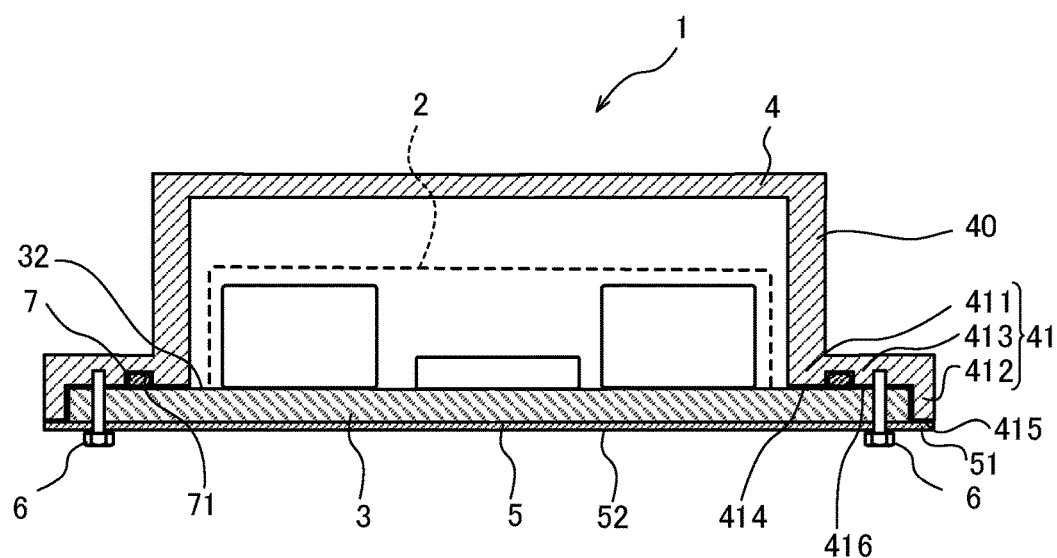
FIG. 2 is a schematic configuration diagram illustrating a shield case according to a second embodiment.

Referring to FIG. 2, the following describes the shield case 1 according to a second embodiment.

FIG. 2 is a schematic configuration diagram illustrating the shield case 1 according to the second embodiment. The second embodiment is different from the shield case 1 of the first embodiment in that the side-wall end portion 41 of the cover portion 4 includes an extension portion 413 extending toward an outside direction of the shield case 1. Note that, in the following embodiment, a constituent having the same function as a constituent in the first embodiment has the same reference sign as the constituent in the first embodiment, and descriptions are made by omitting redundant descriptions appropriately.

As illustrated in FIG. 2, the side-wall end portion 41 of the cover portion 4 includes the first end 411 the end surface 414 of which abuts with the mounting surface 32 of the base portion 3, the extension portion 413 extending toward the outside direction of the shield case 1 from the first end 411, and the second end 412 extending from the extension portion 413 toward the metal plate 5 such that the distal surface 415 abuts with the end portion 51 of the metal plate 5.

The extension portion 413 connects the first end 411 to the second end 412. A bottom face 416 of the extension portion 413 and the end surface 414 of the first end 411 form one plane and abut with the mounting surface 32 of the base portion 3. Hereby, in comparison with a case where the side-wall end portion 41 of the cover portion 4 does not include the extension portion 413, a width of an abutment plane between the side-wall end portion 41 of the cover portion 4 and the mounting surface 32 of the base portion 3 becomes large.

An internal thread is cut in a central part of the bottom face 416 of the extension portion 413 so that a bolt can be fastened thereto, and respective through-holes for the bolt are provided in the base portion 3 and the metal plate 5, at respective positions corresponding to the internal thread, the positions being close to the end portions of the base portion 3 and the metal plate 5. A cylindrical collar made of metal or the like is inserted into the through-hole provided in the base portion 3.

When the bolt 6 is screwed into the internal thread of the extension portion 413 in the side-wall end portion 41 through the through-holes of the metal plate 5 and the base portion 3 from the outer surface 52 of the metal plate 5, the cover portion 4, the base portion 3, and the metal plate 5 are fastened jointly and fixed in an integrated manner. When the bolt 6 is screwed into the first end 411, a large width of the end surface 414 of the first end 411 into which the bolt 6 is screwed should be secured by thickening a thickness of the side wall 40. In the meantime, in the present embodiment, the bolt 6 is screwed into the extension portion 413. On this account, it is not necessary to secure the width of the end surface 414 of the first end 411 so that the bolt 6 is screwed into the end surface 414, thereby resulting in that the thickness of the side wall 40 can be made thin.

A seal groove 71 is provided on the bottom face 416 of the extension portion 413, at a position closer to the inner side than the position where the bolt 6 is screwed, and a sealing member such as a gasket 7 is fitted into the seal groove 71.

By providing the sealing member at the position closer to the inner side than the bolt 6, it is possible to prevent water or the like from entering the shield case 1 from outside.

Note that, in the present embodiment, the seal groove 71 is formed on the bottom face 416 of the extension portion 413. However, the position where the seal groove 71 is formed is not limited to this, provided that the position is closer to the inner side than the position where the bolt 6 is screwed. For example, the seal groove 71 may be formed on the end surface 414 of the first end 411 or may be formed over the end surface 414 of the first end 411 and the bottom face 416 of the extension portion 413.

The shield case 1 of the second embodiment described above can yield the following effects.

In the shield case 1, the side-wall end portion 41 of the cover portion 4 includes the extension portion 413 extending toward the outside direction of the shield case 1 and connecting the first end 411 to the second end 412. The bolt 6 by which the cover portion 4, the base portion 3, and the metal plate 5 are fastened jointly is screwed into the internal thread cut in the extension portion 413. Accordingly, it is not necessary to secure the width of the end surface 414 of the first end 411 so that the bolt 6 is screwed into the end surface 414, thereby resulting in that the thickness of the side wall 40 can be made thin. Hereby, in comparison with a case where the bolt 6 is screwed into the first end 411, that is, the side-wall end portion 41 of the cover portion 4 does not include the extension portion 413, it is possible to achieve a weight reduction and a cost reduction.

The shield case 1 includes the extension portion 413 extending toward the outside direction of the shield case 1, and the bottom face 416 of the extension portion 413 and the end surface 414 of the first end 411 form one plane and abut with the mounting surface 32 of the base portion 3. Hereby, in comparison with a case where the side-wall end portion 41 of the cover portion 4 does not include the extension portion 413, the width of the abutment plane between the side-wall end portion 41 of the cover portion 4 and the mounting surface 32 of the base portion 3 becomes large. Hereby, it is possible to secure a large width of a plane for sealing the cover portion 4 and the base portion 3. On this account, a degree of freedom of a sealing structure increases. For example, the seal groove 71 can be provided as a gasket groove, and a rubber gasket can be selected as a sealing member. This improves a sealing property of the cover portion 4 and the base portion 3.

Note that, similarly to the first embodiment, the setting direction of the shield case 1 can be determined to be any direction. For example, the shield case 1 may be provided in a reverse manner in the up-down direction from the state in FIG. 2 so that the metal plate 5 is placed on the upper side and the cover portion 4 is placed on the lower side, or the shield case 1 may be provided in an inclined state. In a case where the shield case 1 is provided in a reverse manner in the up-down direction, in order to prevent water or the like from entering the shield case 1 through the through-hole for the bolt 6, it is preferable that the orientation of the bolt 6 be also reversed in the up-down direction, and the cover portion 4, the base portion 3, and the metal plate 5 be fastened jointly by the bolt 6 by use of a weld nut from the extension portion 413 side of the side-wall end portion 41 of the cover portion.

Third Embodiment

Figure 3:
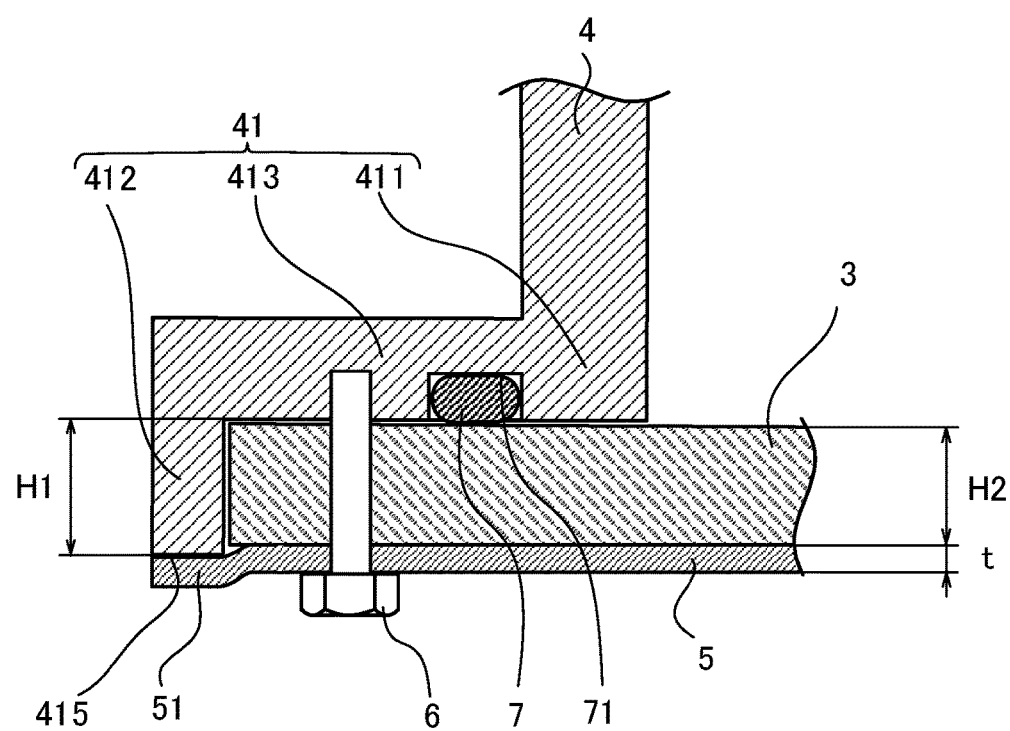
FIG. 3 is a partial enlarged view illustrating abutment parts of a cover portion with a base portion and a metal plate in a shield case according to a third embodiment.
Figure 4:
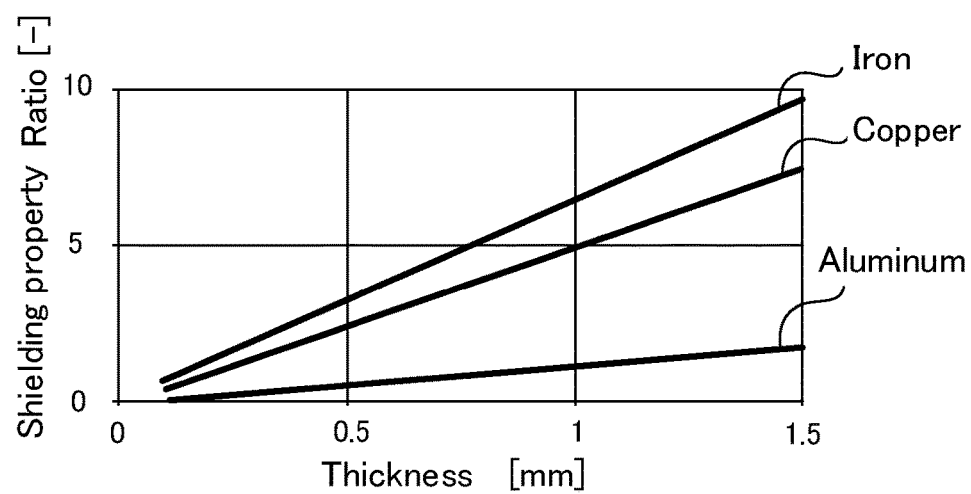
FIG. 4 is a graph illustrating a relationship between a material, a thickness, and a shielding property of a metal plate.

Referring to FIGS. 3 and 4, the following describes the shield case 1 according to a third embodiment.

FIG. 3 is a partial enlarged view illustrating abutment parts of the cover portion 4 with the base portion 3 and the metal plate 5 in the shield case 1 according to the third embodiment. The third embodiment is different from the shield case 1 of the second embodiment in that a length H 1, in the thickness direction of the base portion 3, of the second end 412 in the side-wall end portion 41 of the cover portion 4 is longer than a thickness $H_2$ of the base portion 3.

As illustrated in FIG. 3, the length $H_1$, in the thickness direction of the base portion 3, of the second end 412 in the side-wall end portion 41 of the cover portion 4 is made longer than the thickness $H_2$ of the base portion 3.

Similarly to the first and second embodiments, a cylindrical collar made of metal or the like is inserted into the through-hole, in the base portion 3, through which the bolt 6 is passed. The collar may project from one end of the through-hole of the base portion 3. In this case, the length $H_1$, in the thickness direction of the base portion 3, of the second end 412 in the side-wall end portion 41 of the cover portion is formed to be longer than a length of the collar in its cylindrical direction.

The thickness of the metal plate 5 is set to a thickness t that allows the metal plate 5 to deform when the cover portion 4, the base portion 3, and the metal plate 5 are fastened jointly by the bolt 6.

When the cover portion 4, the base portion 3, and the metal plate 5 are fastened jointly by the bolt 6, the end portion 51 of the metal plate 5 is pressed against the base portion 3 while the end portion 51 abuts with the distal surface 415 of the second end 412 in the side-wall end portion 41 of the cover portion 4, and then, as illustrated in FIG. 3, the end portion 51 deforms while the end portion 51 abuts with the distal surface 415 of the second end 412. Hereby, the cover portion 4 abuts with the metal plate 5 more firmly without any gap, so that a high shielding property is secured.

Note that, the thickness t of the metal plate 5 is determined based on a shielding characteristic, a deformation characteristic, and stress of a material of the metal 5. The shielding characteristic of the material is a characteristic of each type of material in terms of a relationship between the thickness t and the shielding property of the metal plate 5, and the deformation characteristic of the material is a characteristic of each type of material in terms of a relationship between the thickness t of the metal plate 5 and a deformation amount d of the metal plate 5 in a case where the same force is applied to the metal plate 5. Further, the stress as used herein is a resisting force caused in a deformed part when the metal plate 5 deforms.

Figure 5:
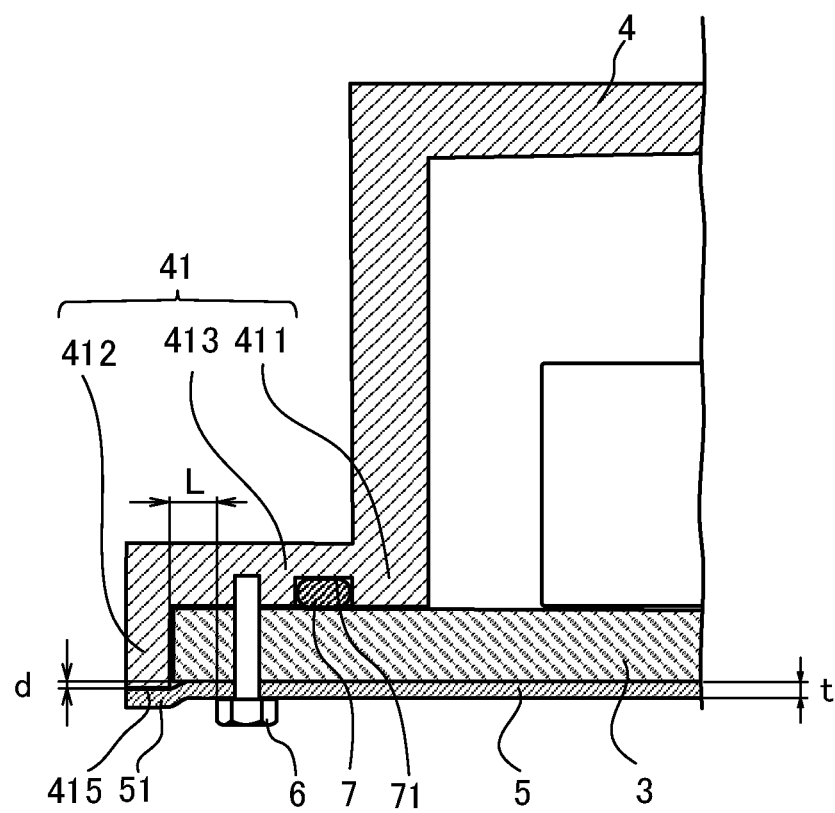
FIG. 5 is a partial enlarged view illustrating the abutment parts of the cover portion with the base portion and the metal plate in the shield case.
Figure 6:
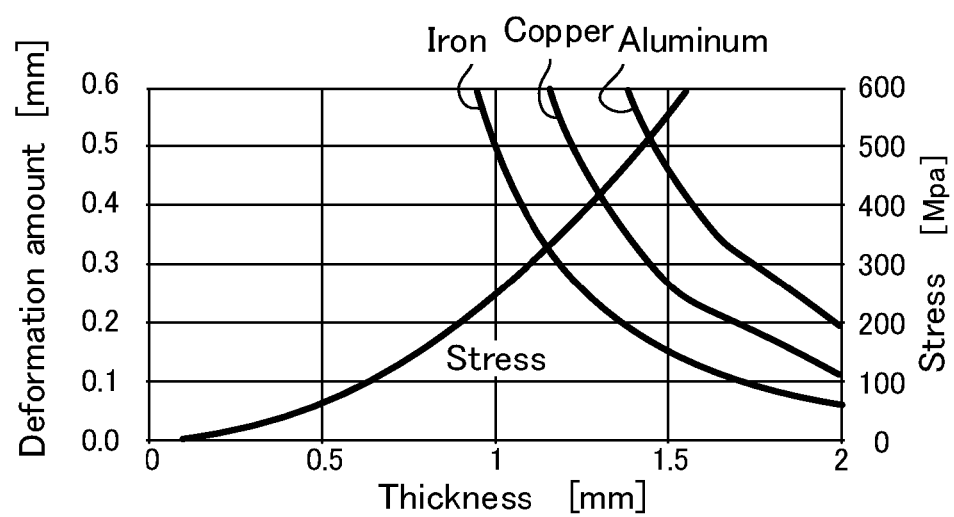
FIG. 6 is a graph illustrating a thickness of the metal plate, a stress caused when the metal plate deforms, and a deformation amount.

With reference to FIGS. 4 to 6, the following describes a validity range of the thickness t of the metal plate 5. As the material of the metal plate 5, aluminum, iron, copper, and so on can be considered.

FIG. 4 is a graph illustrating a relationship between the material, the thickness t, and the shielding property of the metal plate 5. In a case where the shielding property of the metal plate 5 is taken as a reference value 1 when the metal plate 5 is made of an aluminum material and the thickness t of the metal plate 5 is 0.8 mm, the relationship between each material, the thickness t, and the shielding property of the metal plate 5 exhibits a tendency illustrated in FIG. 4. As illustrated in FIG. 4, in any material, as the thickness t of the metal plate 5 is larger, the shielding property improves. Further, it is found that, in a case of iron or copper, when the thickness is around 0.15 mm, the metal plate 5 has a shielding property equivalent to that in the case where the aluminum material having a thickness of 0.8 mm is used.

FIG. 5 is a partial enlarged view illustrating the abutment parts of the cover portion 4 with the base portion 3 and the metal plate 5 in the shield case 1, and FIG. 6 is a graph illustrating the stress and the deformation amount d to the thickness t of the metal plate 5 when the metal plate 5 deforms. Here, the calculation is performed by use of a formula of a general rectangular beam in strength of materials.

A distance (a fastening pitch length) between a bolt by which the cover portion 4, the base portion 3, and the metal plate 5 are fastened jointly and its adjacent bolt is taken as a width of the rectangular beam, and here, the distance is 100 mm. Secondly, a length (a length indicated by L in FIG. 5) from a point where the cover portion 4 makes contact with the metal plate 5 to a flange outer periphery of the bolt 6 is taken as a length of the rectangular beam, and here, the length is 18 mm.

A force to deform the metal plate 5 is a part of a fastening force of the bolt 6, but when a large force is used for deformation of the metal plate 5, a force to fix a component becomes insufficient. The fastening force of the bolt 6 is also required as a sealing force between the cover portion 4 and the base portion 3, and therefore, a bolt fastening force to be used for deformation of the metal plate 5 cannot be made so large. In view of this, a force to be used for deformation of the metal plate 5 is 10% of the fastening force of the bolt 6 and is calculated as 474 N.

The relationship between the material, the thickness t, and the deformation amount d of the metal plate 5 when the above force is applied to the metal plate 5 is as illustrated in FIG. 6. As illustrated in FIG. 6, even with the same thickness t, for example, iron has a smaller deformation amount d than those of copper and aluminum. Further, for example, when it is considered that a deformation amount d equal to or more than 0.3 mm is required, the thickness t of the metal plate 5 should be equal to or less than about 1.2 mm in the case of iron, the thickness t of the metal plate 5 should be equal to or less than about 1.4 mm in the case of copper, and the thickness t of the metal plate 5 should be equal to or less than about 1.7 mm in the case of aluminum.

The stress is determined by a shape and does not have relation with the type of material. Accordingly, the relationship between the stress caused in a deformed part when the metal plate 5 deforms and the thickness of the metal plate 5 is indicated by one curve illustrated in FIG. 6. In terms of the stress, it is necessary to determine the thickness t of the metal plate 5 within a range where the stress does not exceed the strength limit of each material.

Figure 7:
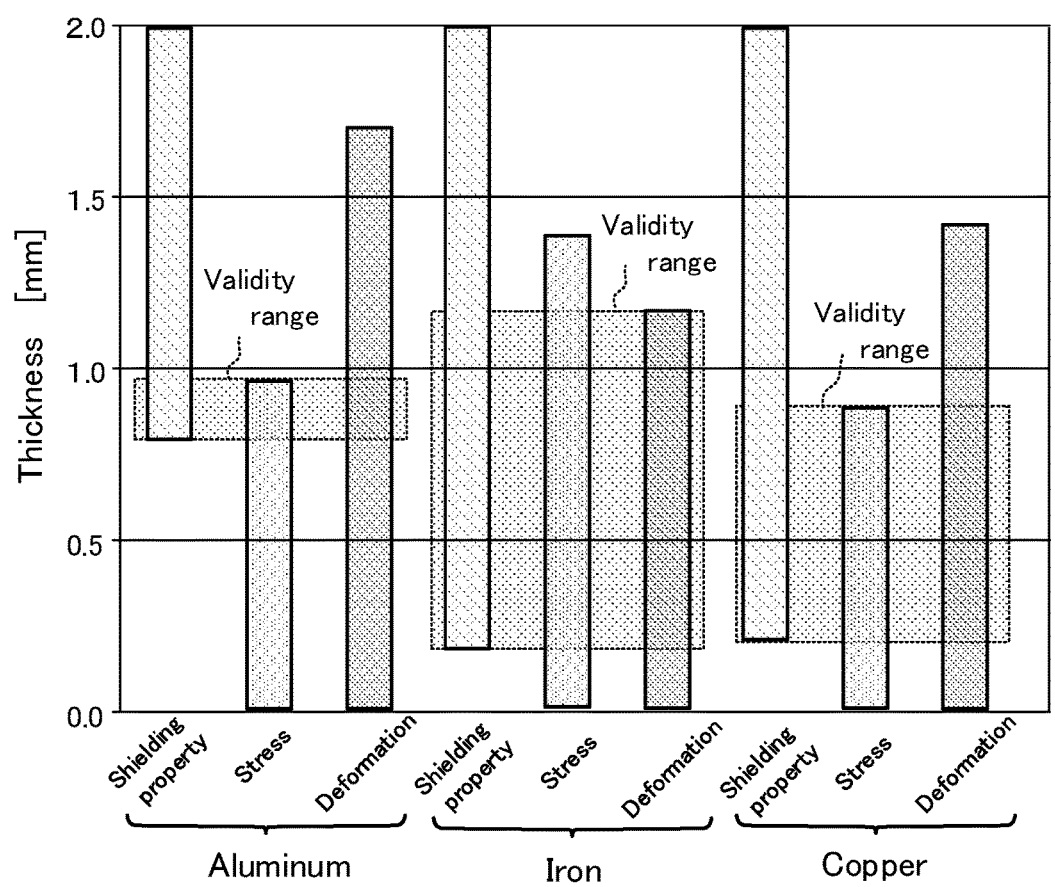
FIG. 7 is a graph illustrating an example of a validity range of the thickness of a metal plate.

FIG. 7 is a graph illustrating an example of a validity range of the thickness t of the metal plate 5. In terms of the shielding property, a case where the shielding property is equal to or more than the reference value 1 is assumed as an achievable range. In terms of the stress, a range where the stress does not exceed the strength limit of each material is assumed as an achievable range. In terms of the deformation amount d, a case where the deformation amount is equal to or more than 0.3 mm is assumed as an achievable range. A part where respective achievable ranges of the shielding property, the stress, and the deformation amount overlap each other is the validity range of the thickness t of the metal plate 5, and the thickness t of the metal plate 5 can be determined freely within the range.

As such, the validity range of the thickness t of the metal plate 5 is determined based on the shielding characteristic and the deformation characteristic of the material of the metal 5 and the stress.

The shield case 1 according to the third embodiment can yield the following effect in addition to the effects obtained by the shield cases 1 of the first and second embodiments.

The length $H_1$, in the thickness direction of the base portion 3, of the second end 412 of the cover portion 4 is made longer than the thickness $H_2$ of the base portion 3. Accordingly, when the cover portion 4, the base portion 3, and the metal plate 5 are fastened jointly by the bolt 6, the metal plate 5 deforms while the metal plate 5 abuts with the distal surface 415 of the second end 412. Hereby, the cover portion 4 can abut with the metal plate 5 more firmly without any gap, so that a high shielding property can be secured.

The embodiments of the present invention have been described above, but the embodiments just show some applications of the present invention and are not intended to limit the technical scope of the present invention to the concrete configurations of the embodiments.

Each of the embodiments described above has been described as an independent embodiment, but the embodiments may be combined appropriately.

The invention claimed is:

1. A shield case in which an electronic component is storable, the shield case comprising:
    a base portion made of a nonmetal material and having a mounting surface on which the electronic component is mounted;
    a cover portion made of a metal material and covering surroundings of the electronic component; and
    a metal plate abutting with a whole outer surface of the base portion and having an end portion projecting outward from the base portion; wherein:
    the cover portion comprises a side-wall end portion that comprises:
        a first end abutting with the mounting surface of the base portion,
        a second end extending in a thickness direction of the base portion and abutting with the end portion of the metal plate, and
        an extension portion connecting the first end to the second end; and
    the extension portion extends in an outward direction of the shield case and has a bottom face abutting with the mounting surface of the base portion.

2. The shield case according to claim 1, wherein:
    a length of the second end extending in the thickness direction of the base portion is longer than a thickness of the base portion.

3. The shield case according to claim 2, further comprising:
    a fastening member by which the metal plate, the base portion, and the first end of the cover portion are fastened jointly in the thickness direction of the base portion; wherein:
    the metal plate has a thickness that allows the metal plate to deform when the metal plate, the base portion, and the first end of the cover portion are fastened jointly.

4. The shield case according to claim 3, wherein:
    the thickness of the metal plate is determined based on a shielding characteristic and a deformation characteristic of a material of the metal plate and a stress caused in a deformed part when the metal plate deforms.

5. A shield case in which an electronic component is storable, the shield case comprising:
    a base portion made of a nonmetal material and having a mounting surface on which the electronic component is mounted;

a cover portion made of a metal material and covering surroundings of the electronic component; and a metal plate abutting with a whole outer surface of the base portion and having an end portion projecting outward from the base portion; wherein:

the cover portion comprises a side-wall end portion that comprises:
- a first end abutting with the mounting surface of the base portion, and
- a second end extending in a thickness direction of the base portion and abutting with the end portion of the metal plate; and a length of the second end in the thickness direction of the base portion is longer than a thickness of the base portion.

6. The shield case according to claim 5, wherein:

the side-wall end portion of the cover portion further comprises an extension portion connecting the first end to the second end; and the extension portion extends in an outward direction of the shield case and has a bottom face abutting with the mounting surface of the base portion.

7. The shield case according to claim 5, further comprising:

a fastening member by which the metal plate, the base portion, and the first end of the cover portion are fastened jointly in the thickness direction of the base portion; wherein:

the metal plate is configured to have a thickness that allows the metal plate to deform when the metal plate, the base portion, and the first end of the cover portion are fastened jointly.

8. The shield case according to claim 7, wherein:

the thickness of the metal plate is determined based on a shielding characteristic and a deformation characteristic of a material of the metal plate and a stress caused in a deformed part when the metal plate deforms.

* * * * *